United States Patent
Adolf et al.

(10) Patent No.: US 9,864,035 B2
(45) Date of Patent: Jan. 9, 2018

(54) MEASUREMENT OF RADIO FREQUENCY EXCITATION PULSES

(71) Applicants: Holger Adolf, Zirndorf (DE); Thomas Benner, Erlangen (DE); Hans-Peter Fautz, Forchheim (DE); Jörg Ulrich Fontius, Neunkirchen A. Brand (DE); Rene Gumbrecht, Herzogenaurach (DE); Franz Schmitt, Erlangen (DE)

(72) Inventors: Holger Adolf, Zirndorf (DE); Thomas Benner, Erlangen (DE); Hans-Peter Fautz, Forchheim (DE); Jörg Ulrich Fontius, Neunkirchen A. Brand (DE); Rene Gumbrecht, Herzogenaurach (DE); Franz Schmitt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 606 days.

(21) Appl. No.: 14/481,596

(22) Filed: Sep. 9, 2014

(65) Prior Publication Data

US 2015/0077108 A1    Mar. 19, 2015

(30) Foreign Application Priority Data

Sep. 13, 2013   (DE) ........................ 10 2013 218 371

(51) Int. Cl.
*G01V 3/00* (2006.01)
*G01R 33/54* (2006.01)
(Continued)

(52) U.S. Cl.
CPC .......... *G01R 33/543* (2013.01); *G01R 33/36* (2013.01); *G01R 33/5659* (2013.01)

(58) Field of Classification Search
USPC ........................................................ 324/309
See application file for complete search history.

(56) References Cited

U.S. PATENT DOCUMENTS

| 6,433,546 B1 | 8/2002 | Kroeckel et al. |
| 2006/0054810 A1 | 3/2006 | Grasslin et al. |

(Continued)

FOREIGN PATENT DOCUMENTS

| CN | 1735814 A | 2/2006 |
| CN | 101271150 A | 9/2008 |

(Continued)

OTHER PUBLICATIONS

German Office Action cited in DE 10 2013 218 371.2, dated Apr. 3, 2014.

(Continued)

*Primary Examiner* — Rodney Fuller
(74) *Attorney, Agent, or Firm* — Lempia Summerfield Katz LLC

(57) ABSTRACT

Methods are provided for measurement of RF excitation pulses by a magnetic resonance device. The methods include the following acts: (1) sending of an RF excitation pulse by a radio-frequency system of the magnetic resonance device, (2) triggering of a receive event for capturing the RF excitation pulse by the control device of the magnetic resonance device, and (3) capturing of the sent RF excitation pulse in the form of excitation data by the radio frequency system. The excitation data may be used for checking process execution sequences.

16 Claims, 2 Drawing Sheets

(51) Int. Cl.
*G01R 33/36* (2006.01)
*G01R 33/565* (2006.01)

(56) References Cited

U.S. PATENT DOCUMENTS

| | | |
|---|---|---|
| 2008/0231280 A1 | 9/2008 | Greim et al. |
| 2013/0038329 A1 | 2/2013 | Gebhardt et al. |
| 2013/0101198 A1* | 4/2013 | Grodzki ............. G01R 33/4816 382/131 |
| 2014/0086468 A1* | 3/2014 | Grodzki ........... G01R 33/56572 382/131 |
| 2014/0091795 A1* | 4/2014 | Grodzki ............... G01R 33/543 324/309 |
| 2015/0088230 A1 | 3/2015 | Toader et al. |
| 2015/0091568 A1* | 4/2015 | Grodzki ............. G01R 33/4822 324/309 |

FOREIGN PATENT DOCUMENTS

| | | |
|---|---|---|
| CN | 102928795 A | 2/2013 |
| DE | 19911975 | 9/2000 |
| WO | WO2011107917 A1 | 9/2011 |

OTHER PUBLICATIONS

Gumbrecht, Rene et al., Vortrag "Online Local SAR Supervision for Transmit Arrays at 7T"; Proceedings of the 21st Annual Meeting of ISMRM; Salt Lake City, Utah, USA. 2013.

German office Action for related German Application No. 10 2013 218 371.2 dated Jun. 21, 2016 with English Translation.

Chinese office Action for related Chinese Application No. 201410458758X dated Jul. 14, 2016 with English Translation.

* cited by examiner

MEASUREMENT OF RADIO FREQUENCY EXCITATION PULSES

CROSS-REFERENCE TO RELATED APPLICATIONS

This application claims the benefit of DE 10 2013 218 371.2, filed on Sep. 13, 2013, which is hereby incorporated by reference in its entirety.

TECHNICAL FIELD

The present embodiments relate to methods for measurement of RF excitation pulses by a magnetic resonance device, a magnetic resonance device that is equipped to carry out the method, a corresponding computer program that makes it possible to carry out the method, and a computer-readable storage medium.

The embodiments lie in the fields of medical technology and information technology, and, in particular, relate to the control or monitoring of imaging methods and systems, such as diagnostic magnetic resonance (MR) methods and magnetic resonance devices or similar devices.

BACKGROUND

As part of a diagnostic mode of operation, the radio frequency (RF) excitation pulses sent from a magnetic resonance device may not be captured again by the magnetic resonance device. This provides that it may not be possible to compare an actual form of an RF excitation pulse with a required form of an RF excitation pulse.

SUMMARY AND DESCRIPTION

The scope of the present invention is defined solely by the appended claims and is not affected to any degree by the statements within this summary. The present embodiments may obviate one or more of the drawbacks or limitations in the related art.

The object of the embodiments is to specify a method that makes it possible to measure RF excitation pulses by the magnetic resonance device, and thus allow continuous monitoring of the RF excitation pulses.

In the embodiments, a method for measurement of RF excitation pulses by a magnetic resonance device is provided. The method includes the following acts: (1) sending of an RF excitation pulse by a radio-frequency system of the magnetic resonance device, (2) triggering of a receive event for detecting the RF excitation pulse, and (3) capturing of the sent RF excitation pulse in the form of excitation data by the radio frequency system.

The sending of the RF excitation pulse by the radio-frequency system of the magnetic resonance device automatically initiates the receive event for capturing the RF excitation pulse. "Triggering" is to be understood as the initiation mechanism. A "receive event" is to be understood as a signal, (e.g., a trigger signal), which includes the information that the RF excitation pulse was sent (otherwise the signal may not even have been triggered), and also includes programming that makes it possible for the magnetic resonance device to capture the sent RF excitation pulse.

The sent RF excitation pulse is captured by the radio-frequency system of the magnetic resonance device in the form of excitation data. The excitation data includes the form of the RF excitation pulse transmitted.

The embodiments use the sending and capture of an RF excitation pulse with a radio-frequency system of a magnetic resonance device, e.g., with receive hardware already present in any event, and thus makes possible the measurement of the RF excitation pulse actually sent. In this way, deviations between the RF excitation pulse actually sent and a required form of the RF excitation pulse will be detected.

In certain embodiments, the excitation data is captured by at least one directional coupler or at least one pickup loop. In this case, a directional coupler provides a component that may branch off a part of an electromagnetic wave travelling in a conductor in a direction-dependent manner. A pickup loop refers to an antenna component, which in connection with a receive facility, detects a part of emanated electromagnetic wave. In this way, an efficient capture of the excitation data is achieved, and it is possible to only take account of those electromagnetic waves that are travelling in the direction of a patient.

In one embodiment, an echo signal resulting from the RF excitation pulse is captured in the form of echo data by the radio-frequency system. By this method, the excitation data and the echo data, (e.g., nuclear spin echo signals), are captured. This additionally makes imaging with the magnetic resonance device possible.

In a further embodiment, a temporal switching between capturing the excitation data and capturing the echo data is realized by a switching matrix. A switching matrix is a technical solution for switching twin wires and makes it possible to use the same radio-frequency system for both capturing the excitation data and also capturing the echo data. An automatic switching matrix may be used that makes possible remote-controlled switching and/or switching by the magnetic resonance device. Thus, the capture of two different types of data with only one RF system is possible. This reduces the time outlay and also the error sources for execution and documentation of the switching. The fact that no additional receive module is needed for capturing the RF excitation pulses makes a further contribution to cost savings.

In an embodiment, the excitation data and the echo data are provided with a time stamp. A "time stamp" refers to any kind of information that allows a unique assignment between the excitation data and the associated echo data, such as a time of capture of the excitation data and the time of capture of the echo data. The time stamp may be a time of day, accurate to the millisecond, in ASCII format. This enables the respective time of the data capture to be established. Temporal correlations between the excitation data and the echo data may however also be established. The excitation data and the associated echo data may however also be provided with a unique label, which allows mutual assignment.

In certain embodiments, the excitation data and the echo data are stored in the form of a raw dataset. A raw dataset is a dataset that includes the information of the measurement process, such as measured variables and associated measured values of the underlying data for example. This makes it possible to safeguard the excitation data and the echo data and also allows post-processing of the datasets.

In one embodiment, the excitation data is used for checking process execution sequences. Only through the presence of the excitation data, (e.g., through the presence of direct comparisons between RF excitation pulses actually sent and required forms of the RF excitation pulses), may direct effects of any deviations of the RF excitation pulses actually sent and required forms of the RF excitation pulses be established. This makes it possible, for example, to carry out a quality check and to determine the quality of the sent RF excitation pulses or to search for specific errors, if for example the RF excitation pulses actually sent deviates with certain regularity from the required forms of the RF excitation pulses. It is also possible to remedy artifacts in the image data, e.g., to clear undesired errors that result from these types of deviations. The checking of process execution sequences also includes monitoring of a local specific absorption rate, e.g., the monitoring of absorption of electromagnetic field energy in biological tissue, for example, during the examination of a living object. The monitoring of the local specific absorption rate includes the determination of virtual observation points for a conservative estimation of a maximum local specific absorption rate. This monitoring serves to enhance the safety of the living examination object.

In a further embodiment, the excitation data is output at an output unit of the magnetic resonance device for monitoring the excitation data. This enables the RF excitation pulses to be monitored directly in real time. Any errors may thus be immediately inspected and rectified. Thus, for example, measurements belonging to incorrect RF pulses may be repeated or corrected retrospectively in a post-processing act.

A magnetic resonance device for measurement of RF excitation pulses is also provided. In the embodiments, the magnetic resonance device includes a radio-frequency system, a control device, and an output unit, The MR device is provided for carrying out the following acts: (1) sending of an RF excitation pulse by the radio-frequency system, (2) triggering of a receive event for capturing the RF excitation pulse by the control device, and (3) capturing of the sent RF excitation pulse in the form of excitation data by the radio frequency system.

The embodiments further describe a computer program that may be loaded into a memory unit of a programmable control device or a processing unit of a magnetic resonance device. With this computer program, all or several of the previously described embodiments may be carried out when the computer program is running in the controller or control device of the magnetic resonance device. In such cases, the program may include program functions, (e.g., libraries and auxiliary functions), in order to realize the corresponding embodiments. In other words, the computer program is intended to provide software with which one of the above-described forms of embodiments may be executed or that executes this form of embodiment. In such cases, the software may involve a source code that still has to be compiled and linked or that only has to be interpreted, or may involve an executable software code that only has to be loaded into the corresponding control device for execution.

The present embodiments further relate to a computer-readable storage medium, (e.g., a DVD, a magnetic tape, or a USB stick), on which electronically-readable control information, (e.g., software), is stored. When this information is read from the storage medium and is stored in a controller or processing unit of a magnetic resonance device, forms of embodiment of the previously described method may be carried out.

Advantages of the magnetic resonance device, of the computer program, and of the computer-readable storage medium correspond to advantages of the method, which have been described above in detail. Features, advantages, or alternative forms of embodiment mentioned here are likewise to be transferred to the other claimed objects, and vice versa. In other words, embodiments directed to a device, for example, may also be developed with the features that are described or claimed in conjunction with a method. The corresponding embodiments of the method are embodied in this case by corresponding physical modules, (e.g., by hardware modules).

DETAILED DESCRIPTION

Figure 1:
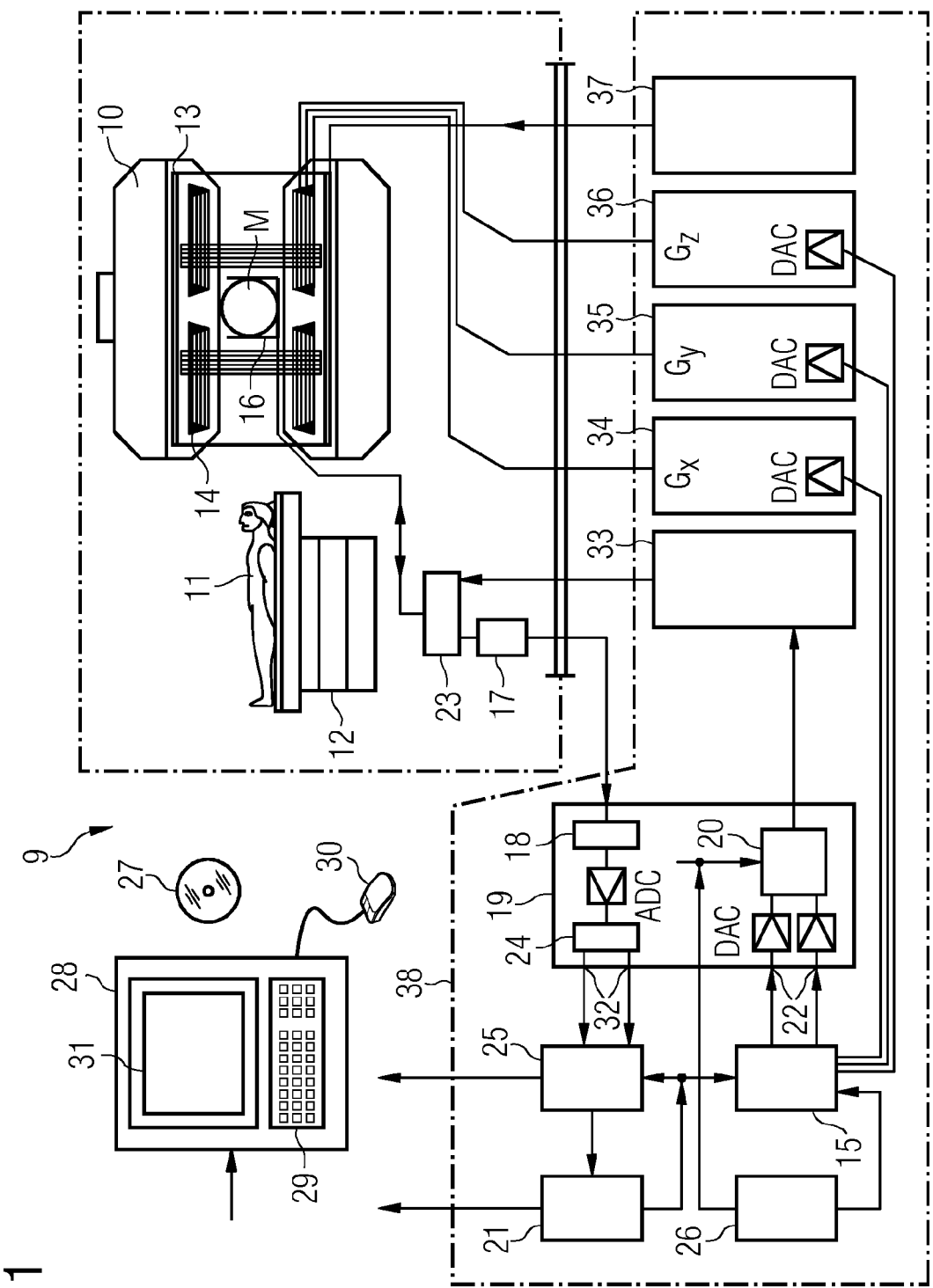
FIG. 1 depicts a schematic diagram of an embodiment of a magnetic resonance device.

FIG. 1 depicts a schematic diagram of a magnetic resonance device 9, which is also referred to as a magnetic resonance imaging device or nuclear spin tomography device. In this device, a basic field magnet 10 of the magnetic resonance device 9 creates a temporally-constant strong magnetic field $B_0$ for polarization or alignment of the nuclear spin in an examination area of an examination object 11, such as the part of a human body to be examined for example that is pushed into the magnetic resonance device 9 for examination lying on an examination table 12. The high homogeneity of the basic magnetic field $B_0$ required for nuclear resonance measurement is defined in a spherical measurement volume M, into which the examination object 11 is pushed. To support the homogeneity requirements, and to eliminate temporally-invariable influences, the magnetic resonance device has so-called shims made of ferromagnetic material at a suitable point. Temporally variable influences are eliminated if they are not required by shim coils 13 and a suitable activation 37 of the shim coils 13.

The basic field magnet 10 also serves as an enclosure for a cylindrical gradient field system 14 of the magnetic resonance device 9, which includes three part windings, for example. Each part winding is provided with power by a corresponding amplifier 34-36 of the magnetic resonance device 9 for creating a linear gradient field, also able to be changed over time in the respective direction of a Cartesian coordinate system. The first part winding of the gradient field system 14 creates a gradient $G_x$ in the x direction, the second part winding creates a gradient $G_y$ in the y direction, and the third part winding creates a gradient $G_z$ in the z direction. The non-linear gradients are also created by the gradient field system 14. The amplifier 34-36 includes a digital-analog converter DAC that is controlled by a sequence control 15 of the magnetic resonance device 9 for timely creation of gradient pulses.

The magnetic resonance device 9 further includes at least one radio-frequency antenna 16 within an area enclosed by the gradient field system 14, which converts the radio frequency pulses emitted by a radio-frequency power amplifier of the magnetic resonance device 9 into a magnetic alternating field for exciting the nuclei and aligning the nuclear spin of the examination object 11 or of the area of the examination object 11 to be examined. The coils are activated and the received signal is evaluated in a control device 38 of the magnetic resonance device 9. The radio-frequency antenna 16 includes one or more RF send coils in the form of for example a ring-shaped, linear, or matrix-shaped arrangement of component coils. The alternating field emanating from the preceding nuclear spin, (e.g., as a rule the nuclear spin echo signals instigated by a pulse sequence of one or more radio-frequency pulses and one or more gradient pulses), is converted by the RF receive coils of the radio-frequency antenna 16 into a voltage, (e.g., into a measurement signal), which is fed via an amplifier 17 to a radio-frequency receive channel of a radio-frequency system 19. The radio-frequency system 19 of the magnetic resonance device 9 further includes at least one send channel 20 in which radio frequency pulses are created for the excitation of the magnetic nuclear resonance. In such cases, the respective radio-frequency pulses are represented digitally as a sequence of complex numbers in the sequence control 15 as a result of a pulse sequence of predetermined by a device processor 21. This number sequence is supplied as a real and as an imaginary part via one input 22 in each case to a digital-analog converter DAC in the radio-frequency system 19 and is supplied by the converter to the send channel 20. In the send channel 20, the pulse sequences are modulated onto a radio-frequency carrier signal, the basic frequency of which corresponds to the resonant frequency of the nuclear spin in the measurement volume. Via an amplifier 33, the modulated pulse sequences of the RF send coil are supplied to the radio-frequency antenna 16.

The switchover from send to receive mode is made by a send-receive switch 23 of the magnetic resonance device 9. The RF send coil of the radio-frequency antenna 16 irradiates the high-frequency pulses for exciting the nuclear spin into the measurement volume M and samples resulting echo signals via the RF receive coils. The corresponding nuclear resonance signals obtained are demodulated in a first demodulator 18 of the receive channel of the radio-frequency system 19 phase-sensitively to an intermediate frequency and are digitized in the analog-digital converter ADC. This signal is further demodulated to the frequency zero. Demodulation to the frequency zero and separation into real and imaginary parts takes place after digitization in the digital domain in a second demodulator 24 of the receive channel of the radio-frequency system 19, which outputs the demodulated data via outputs 32 to an image processor 25.

An MR image is reconstructed from the measurement data obtained in this way by the image processor 25 of the magnetic resonance device 9. The measurement data, the image data, and the control programs are administered via the device processor 21 of the magnetic resonance device 9. As a result of a specification with control programs, the sequence control 15 checks the creation of the desired pulse sequences in each case and the corresponding sampling of the k space. In particular, the sequence control 15 in such cases controls the timely switching of the gradients, transmission of the radio frequency pulses with a defined phase amplitude, and also receipt of the nuclear resonance signals. The time base for the radio-frequency system 19 and the sequence control 15 is provided by a synthesizer 26 of the magnetic resonance device 9. The selection of the corresponding control programs for creating an MR image, which are stored on a computer-readable storage medium 27, (e.g., a DVD), and also the display of the MR image created, is undertaken by a terminal 28 of the magnetic resonance device 9, which includes a keyboard 29, a mouse 30, and an output unit 31 (e.g., a screen).

The magnetic resonance device may include further components. A method of operation of the magnetic resonance device is also known to the person skilled in the art so that a more detailed description of the components will be dispensed with here.

Figure 2:
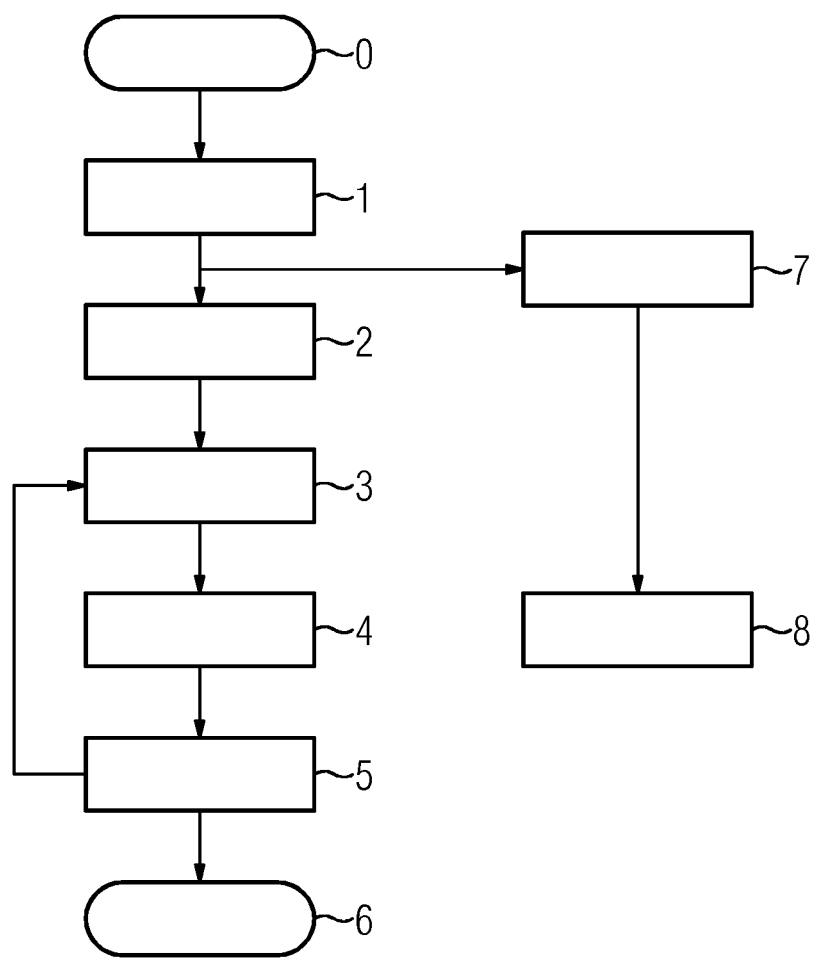
FIG. 2 depicts a flow diagram of an embodiment of a method of measuring radio frequency excitation pulses.

FIG. 2 depicts a flow diagram of an embodiment of the method. The method includes acts 0 to 8, where in the description of the acts 0 to 8, parts of the description including the reference characters introduced in conjunction with the other figures are also used.

Act 0 designates the start of the measurement of RF excitation pulses by a magnetic resonance device 9.

In act 1, an RF excitation pulse is sent by a radio-frequency system 19 and a radio-frequency antenna 16 of the magnetic resonance device 9. In act 2, a receive event for capturing the RF excitation pulse is initiated. In this case, the sending of the RF excitation pulses automatically triggers the receive event for capturing the RF excitation pulses. The receive event is triggered by a control device 38 of the magnetic resonance device 9.

During act 3, the sent RF excitation pulse is captured in the form of excitation data by the radio-frequency system 19 of the magnetic resonance device 9. The excitation data, in this case, includes the form of the RF excitation pulses realized. In one embodiment, the excitation data is captured by at least one directional coupler or at least one pickup loop. In this case, the directional coupler or pickup loop is part of the control device 38 of the magnetic resonance device 9.

In act 7, an echo signal resulting from the RF excitation pulse is captured by the radio-frequency system 19 of the magnetic resonance device 9 in the form of echo data. In this way, the excitation data and the echo data, (e.g., nuclear spin echo signals), are captured. This makes possible imaging with the magnetic resonance device 9. In an embodiment, a temporal switching between the capture of the excitation data and the capture of the echo data is provided by a switching matrix. A switching matrix makes it possible to use the same radio-frequency system 19 for both the capture of the excitation data and also the capture of the echo data. An automatic switching matrix may be used, which makes possible remote-control switching and/or switching by the magnetic resonance device 9. The switching matrix here is part of the control device 38 of the magnetic resonance device 9. Furthermore, the excitation data and the echo data provided by the control device 38 with a time stamp, which includes a point in time and/or a label and allows a unique assignment of the excitation data to the associated echo data.

In act 4, the excitation data and in act 8 the echo data are stored in the form of a raw dataset in a memory unit of the magnetic resonance device 9.

Act 5 relates to the checking of process sequences by the excitation data. The checking is undertaken, for example, by the device processor 21 of the magnetic resonance device 9 or by the terminal 28 of the magnetic resonance device 9. In certain embodiments, the checking may also be undertaken with a further processing unit of the magnetic resonance device 9. Only by the presence of the excitation data, (e.g., by the presence of direct comparisons between RF excitation pulses actually sent and required forms of the RF excitation pulses), may direct effects of any deviations between the RF excitation pulses actually sent and the required forms of the RF excitation pulses be established. This makes it possible to carry out a quality control and to define the quality of the sent RF excitation pulses, to search for specific errors, (if, for example, the actual sent RF excitation pulses deviate from the required forms of the RF excitation pulses with a certain regularity), or to rectify artifacts in the image data, (e.g., clear undesired errors that result from these types of deviations). The checking of process sequences also includes the monitoring of a locally specific absorption rate, e.g., the monitoring of absorption of electromagnetic field energy in biological tissue, for example, during the examination of a living object. The monitoring of the local specific absorption rate includes the determination of virtual observation points for a conservative estimation of a maximum local specific absorption rate.

In one embodiment, the excitation data is output at an output unit 31 of the magnetic resonance device 9 for monitoring the excitation data. This enables a direct monitoring of the RF excitation pulses in real time to be undertaken. Any errors and/or peculiarities may thus be viewed and rectified immediately.

Act 6 identifies the end of the measurement of RF excitation pulses by a magnetic resonance device 9.

A programmable control device 38 of the magnetic resonance device 9 is further embodied such that a computer program is able to be loaded into the memory of the programmable control device 38, with program functions for executing all the aforementioned acts when the computer program is executed in the control device 38 of the magnetic resonance device 9.

In summary, the embodiments relate to methods for measurement of RF excitation pulses by a magnetic resonance device, including the following acts: (1) sending of an RF excitation pulse by a radio-frequency system of the magnetic resonance device, (2) triggering of a receive event for capturing the RF excitation pulse, and (3) capturing of the sent RF excitation pulse in the form of excitation data by the radio frequency system of the magnetic resonance device.

In certain embodiments, the excitation data is used for checking process execution sequences.

The above-described method may be implemented via a computer program product including one or more readable storage media having stored thereon instructions executable by one or more processors of the computing system. Execution of the instructions causes the computing system to perform operations corresponding with the acts of the method described above.

The instructions for implementing processes or methods described herein may be provided on non-transitory computer-readable storage media or memories, such as a cache, buffer, RAM, FLASH, removable media, hard drive, or other computer readable storage media. A processor performs or executes the instructions to train and/or apply a trained model for controlling a system. Computer readable storage media include various types of volatile and nonvolatile storage media. The functions, acts, or tasks illustrated in the figures or described herein may be executed in response to one or more sets of instructions stored in or on computer readable storage media. The functions, acts or tasks may be independent of the particular type of instruction set, storage media, processor or processing strategy and may be performed by software, hardware, integrated circuits, firmware, micro code and the like, operating alone or in combination. Likewise, processing strategies may include multiprocessing, multitasking, parallel processing and the like.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for measurement of radio frequency (RF) excitation pulses by a magnetic resonance device, the method comprising:
sending a RF excitation pulse by a receive module of a radio-frequency system of the magnetic resonance device;
triggering a receive event for capturing the RF excitation pulse;
capturing the sent RF excitation pulse in a form of excitation data by the receive module of the radio-frequency system; and
capturing an echo signal resulting from the RF excitation pulse in a form of echo data by the receive module of the radio-frequency system.

2. The method as claimed in claim 1, wherein the excitation data is detected by at least one directional coupler or at least one pickup loop.

3. The method as claimed in claim 2, further comprising:
checking process execution sequences with the excitation data.

4. The method as claimed in claim 1, wherein the excitation data and the echo data are provided with a time stamp.

5. The method as claimed in claim 1, wherein the excitation data and the echo data are stored in a form of a raw dataset.

6. The method as claimed in claim 1, wherein a temporal switching between the capture of the excitation data and the capture of the echo data is realized by a switching matrix.

7. The method as claimed in claim 6, wherein the excitation data and the echo data are stored in a form of a raw dataset.

8. The method as claimed in claim 6, wherein the excitation data and the echo data are provided with a time stamp.

9. The method as claimed in claim 8, wherein the excitation data and the echo data are stored in a form of a raw dataset.

10. The method as claimed in claim 9, further comprising:
checking process execution sequences with the excitation data.

11. The method as claimed in claim 10, wherein the excitation data is output at an output unit of the magnetic resonance device for monitoring of the excitation data.

12. The method as claimed in claim 1, further comprising:
checking process execution sequences with the excitation data.

13. The method as claimed in claim 1, wherein the excitation data is output at an output unit of the magnetic resonance device for monitoring of the excitation data.

14. A magnetic resonance device for measurement of radio-frequency (RF) excitation pulses, the magnetic resonance device comprising:
a radio-frequency system having a receive module;
a control device; and
an output unit,
wherein the magnetic resonance device is configured to:
(1) send a RF excitation pulse by the receive module of the radio-frequency system; (2) trigger a receive event for capturing the RF excitation pulse; (3) capture the sent RF excitation pulse in a form of excitation data by the receive module of the radio frequency system; and (4) capture an echo signal resulting from the RF excitation pulse in a form of echo data by the receive module of the radio-frequency system.

15. An apparatus comprising:
at least one processor; and
at least one memory including computer program code for one or more programs; the at least one memory and the computer program code configured to, with the at least one processor, cause the apparatus to at least perform:
send a radio-frequency (RF) excitation pulse by a receive module of a radio-frequency system of a magnetic resonance device;
trigger a receive event for capturing the RF excitation pulse;
capture the sent RF excitation pulse in a form of excitation data by the receive module of the radio frequency system; and
capture an echo signal resulting from the RF excitation pulse in a form of echo data by the receive module of the radio-frequency system.

16. A computer program product including one or more non-transitory computer-readable storage media having stored thereon: instructions executable by one or more processors of a computing system, wherein execution of the instructions causes the computing system to perform operations for measuring radio frequency excitation pulses by a magnetic resonance device, the instructions comprising:

sending a radio-frequency (RF) excitation pulse by a receive module of a radio-frequency system of the magnetic resonance device;

triggering a receive event for capturing the RF excitation pulse; and capturing the sent RF excitation pulse in a form of excitation data by the receive module of the radio frequency system; and capturing an echo signal resulting from the RF excitation pulse in a form of echo data by the receive module of the radio-frequency system.

* * * * *